United States Patent [19]

Suzuki

[11] 3,943,377

[45] Mar. 9, 1976

[54] LOGIC CIRCUIT ARRANGEMENT EMPLOYING INSULATED GATE FIELD EFFECT TRANSISTORS

[75] Inventor: Yasoji Suzuki, Kawasaki, Japan

[73] Assignee: Tokyo Shibaura Electric Co., Ltd., Kawasaki, Japan

[22] Filed: Aug. 23, 1974

[21] Appl. No.: 499,924

Related U.S. Application Data

[62] Division of Ser. No. 358,877, May 10, 1973, Pat. No. 3,866,186.

[30] Foreign Application Priority Data

May 16, 1972 Japan.................................. 47-47667
May 29, 1972 Japan.................................. 47-52427
May 29, 1972 Japan.................................. 47-52428

[52] U.S. Cl. ................ 307/205; 307/207; 307/208; 307/215
[51] Int. Cl.² H03K 19/08; H03K 19/34; H03K 19/36
[58] Field of Search ........... 307/205, 207, 208, 214, 307/215, 269

[56] References Cited
UNITED STATES PATENTS

| | | | |
|---|---|---|---|
| 3,250,917 | 5/1966 | Hofstein | 307/205 |
| 3,518,451 | 6/1970 | Booher | 307/205 X |
| 3,524,077 | 8/1970 | Kaufman | 307/205 X |
| 3,551,693 | 12/1970 | Burns et al | 307/205 |
| 3,601,627 | 8/1971 | Booher | 307/205 |
| 3,626,202 | 12/1971 | Pound | 307/205 X |
| 3,747,064 | 7/1973 | Thompson | 307/205 |
| 3,870,897 | 3/1975 | Hatsukano et al | 307/205 X |

*Primary Examiner*—John Zazworsky
*Assistant Examiner*—L. N. Anagnos
*Attorney, Agent, or Firm*—Flynn & Frishauf

[57] ABSTRACT

A logic circuit arrangement consisting of insulated gate field effect transistors of opposite channel types wherein the drain electrode of a single first insulated gate field effect transistor of one channel type is connected to the drain electrode of at least one second insulated gate field effect transistor of the opposite channel type constituting a logic gate. The gate electrode of second transistor is supplied with a data signal and the gate electrode of first transistor and the source electrode of second transistor are supplied with clock pulse signals bearing a complementary relationship with each other. The source electrode of first transistor may receive a clock pulse signal supplied to the source electrode of second transistor or constant voltage; and an output signal from the logic circuit is delivered from the junction of the first and second transistors.

2 Claims, 13 Drawing Figures

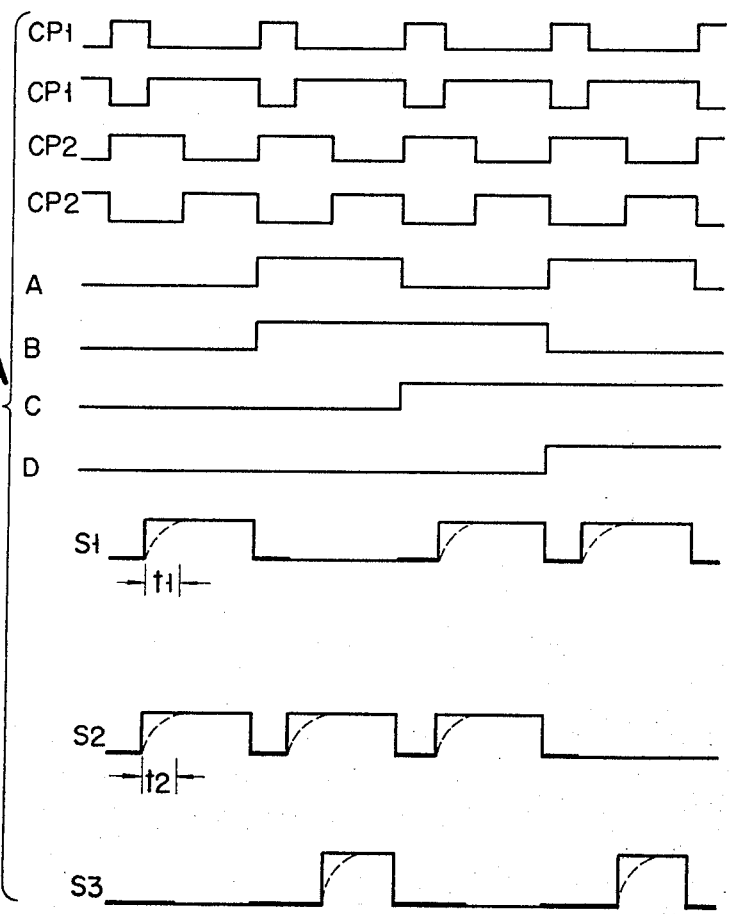

LOGIC CIRCUIT ARRANGEMENT EMPLOYING INSULATED GATE FIELD EFFECT TRANSISTORS

This is a division of application Ser. No. 358,877, filed May. 10, 1973, and now U.S. Pat. No. 3,866,186.

This invention relates a logic circuit arrangement using insulated gate field effect transistors and more particularly to a logic circuit arrangement using insulated gate field effect transistors of opposite channel types.

An electronic computer has a considerable number of logic gates provided as the components of an integrated circuit. In this case, it is demanded that as many logic gates as possible be provided in a single integrated circuit. To this end, logic gates attaining the same function should each consist of as few semiconductor elements as possible.

There has been known a logic circuit using insulated field effect transistors, wherein the conduction path of a single first transistor of one channel type and the conduction paths of a plurality of second transistors of the opposite channel type are connected in series across a D.C. source; the gate electrode of first transistor and that of one second transistor are supplied with a common clock pulse; and the gate electrodes of the remainder of the second transistors constituting logic gates are supplied with data signals; and the aforesaid first and second transistors supplied with a common clock pulse are so designed that while one of them is rendered conducting, the other becomes inoperative and vice versa. Since the conduction path of a single first transistor and those of a plurality of second transistors are not supplied with direct current from the D.C. source, power consumption is indeed saved. But the above-mentioned prior type of logic circuit needs two clock transistors. Though one of the second transistors supplied with a clock pulse signal may be used in common to a plurality of logic circuits, yet the current capacity and in consequence mutual conductance gm of the clock transistor must be increased, causing the transistor to occupy a large space.

It is accordingly an object of this invention to provide a logic circuit which requires only one clock transistor and yet saves power consumption.

Another object of the invention to provide a logic circuit arrangement including very few constituent elements and adapted for formation of an integrated circuit.

According to an aspect of this invention, there is provided a logic circuit arrangement comprising: a single first insulated gate field effect transistor of one channel type having a first and a second electrode defining a conduction path therebetween and a gate electrode; a logic gate means including at least one second insulated gate field effect transistor of the opposite channel type having a first and a second electrode defining a conduction path therebetween and a gate electrode; means for connecting the second electrode of the first transistor and the second electrode of the second transistor, the junction of the first and second transistors being used to draw out an output signal; means for supplying the gate electrode of the first transistor and the first electrode of the second transistor with a first and a second clock pulse signal respectively which have a complementary relationship with each other; and means for supplying a data signal to the gate electrode of the second transistor.

To eliminate erroneous operations likely to accompany the cascade connection of many logic circuits, this invention supplies cascade connected logic circuits with clock pulse signals whose pulse width progressively increases toward the terminal unit of the cascade series.

According to another embodiment, all the logic circuits are supplied with common clock pulses and inverters are disposed between the preceding and succeeding logic circuits.

According to still another embodiment, the first transistors of the preceding and succeeding logic circuits are of opposite channel types and in consequence the second transistors of the circuits are similarly are of opposite channel types. All these logic circuits are supplied with common clock pulse signals.

This invention can be more fully understood from the following detailed description when taken in connection with reference to the accompanying drawings, in which.

Figure 2:
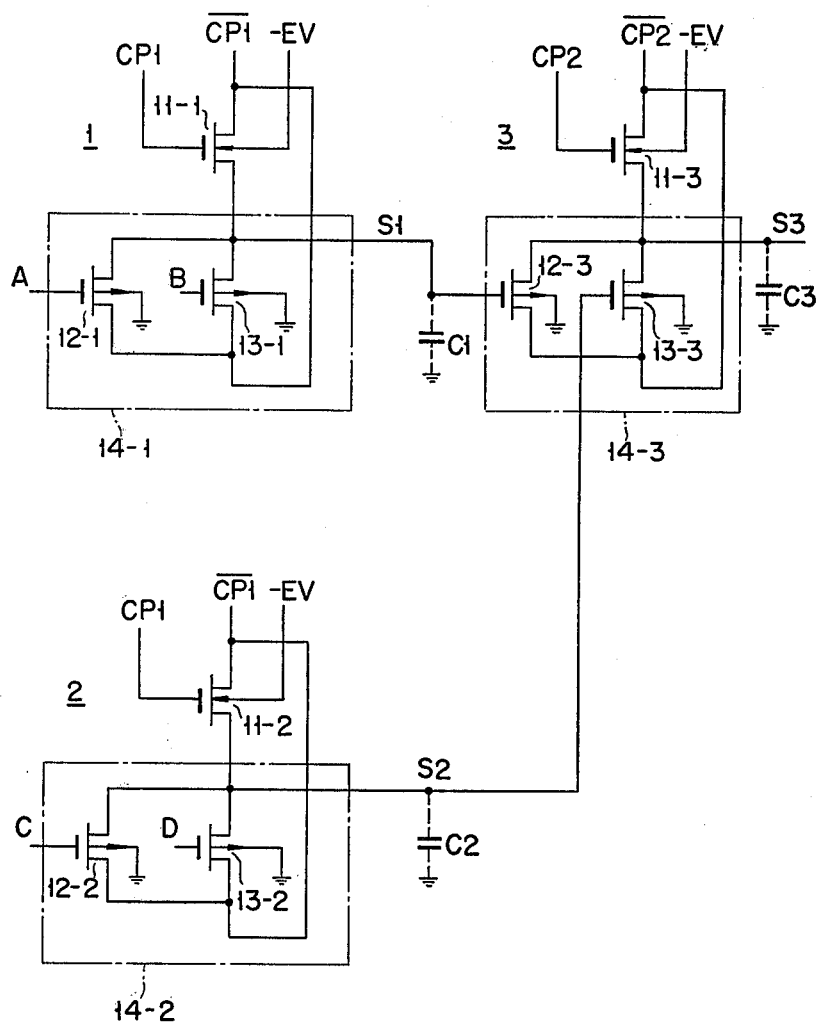
FIG. 2 shows a logic circuit arrangement according to an embodiment of the invention capable of preventing any erroneous operation that might occur where the logic circuits of the invention are cascade connected.
Figure 3B:
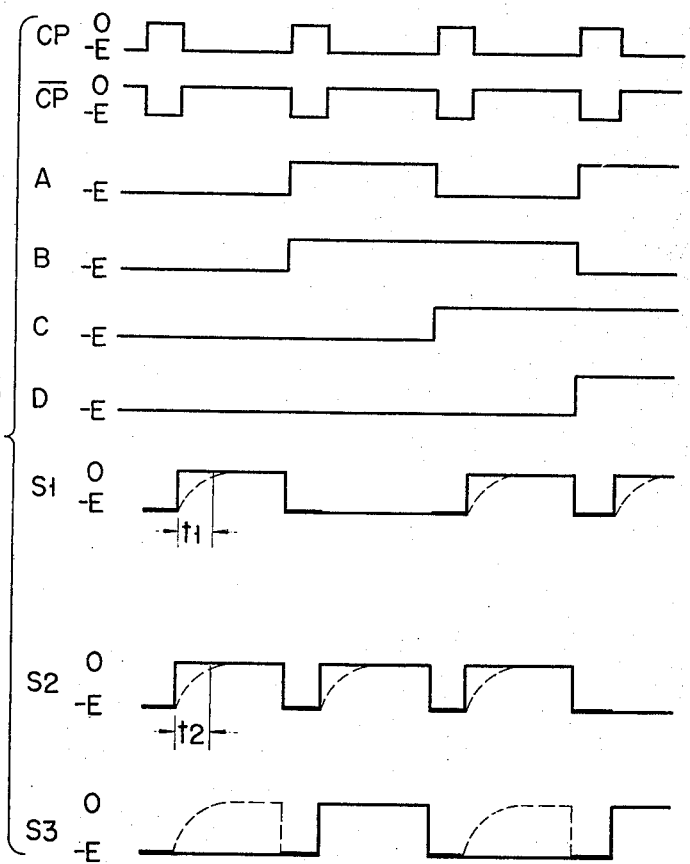
Figure 4:
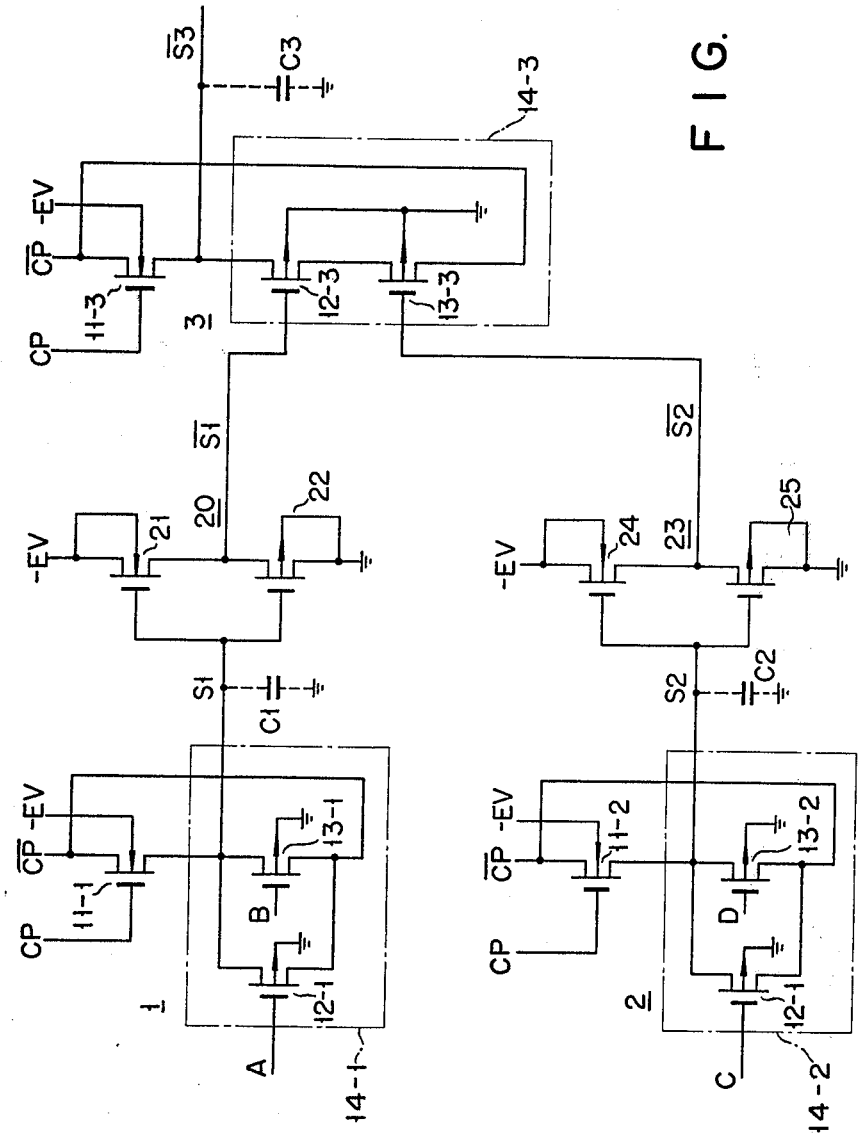
Figure 5:
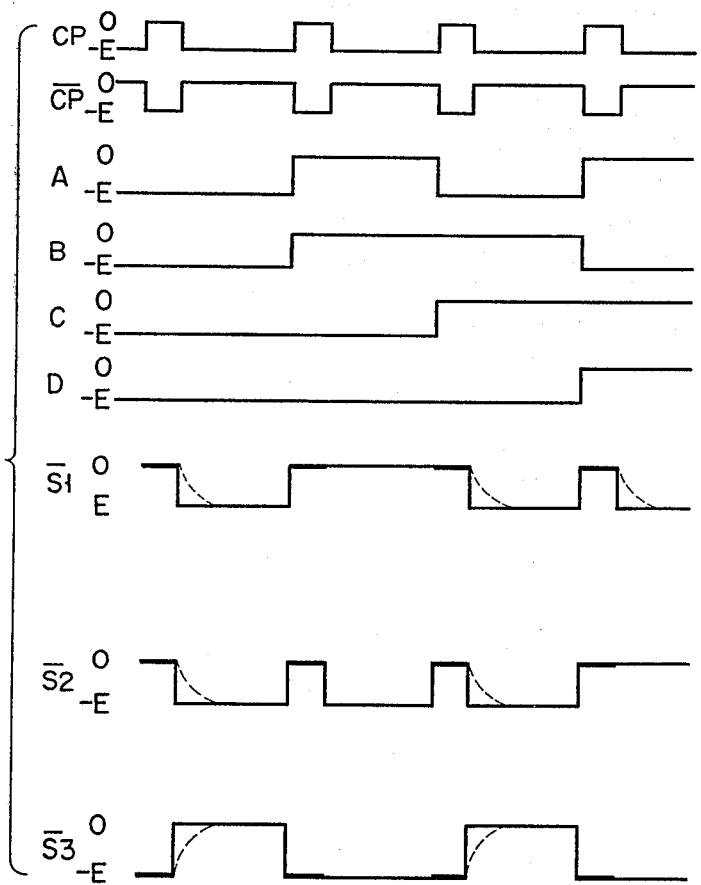
Figure 6:
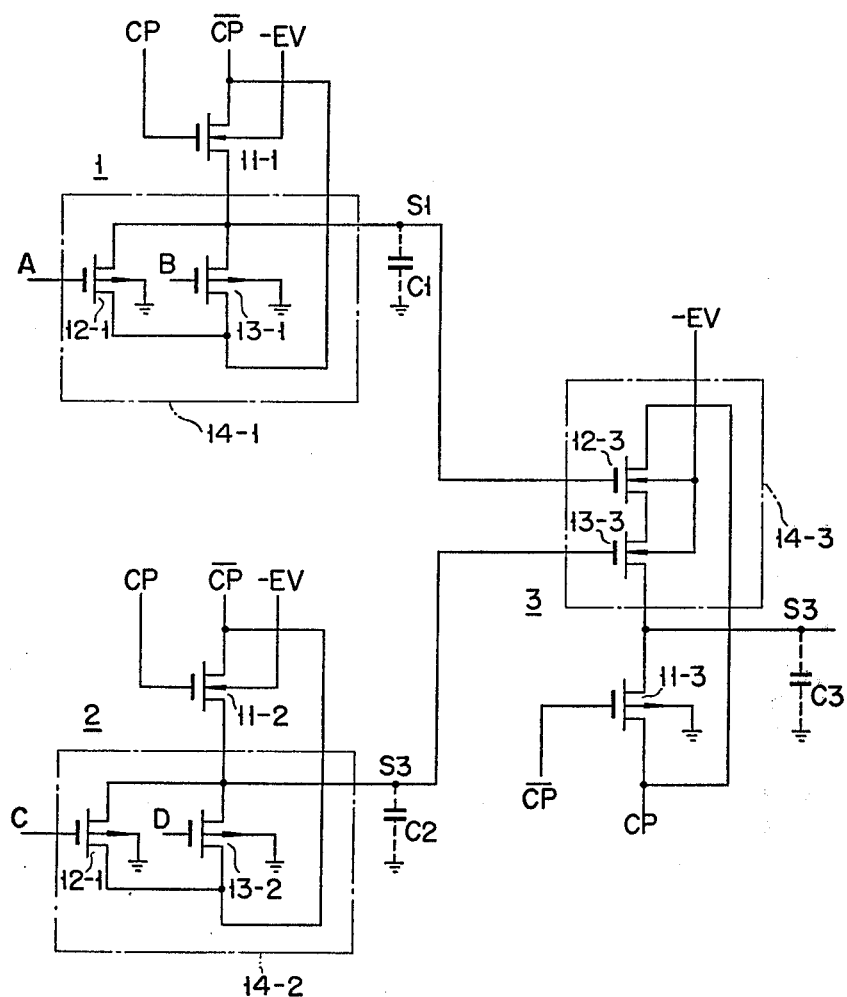
Figure 7:
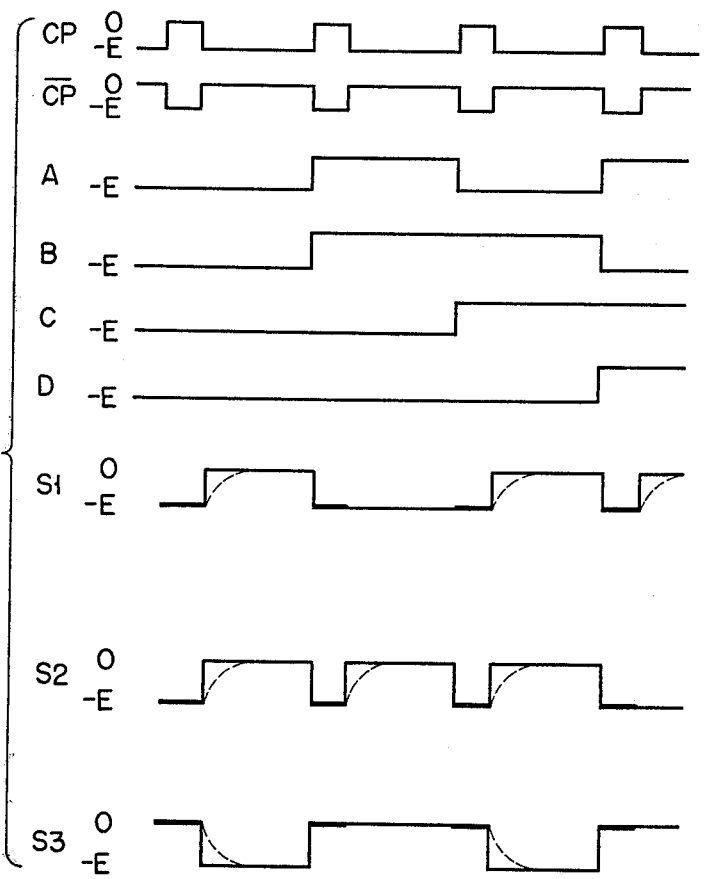

FIG. 3A indicates the wave forms associated with the operation of the logic circuit of FIG. 2;

FIG. 3B is a wave form diagram illustrating the manner in which an erroneous operation is likely to occur where the cascade connected logic circuits of the invention are supplied with common clock pulses;

FIG. 4 shows a logic circuit arrangement according to another embodiment of the invention capable of eliminating any erroneous operation that might arise where the logic circuits of the invention are cascade connected;

FIG. 5 represents the wave forms associated with FIG. 4;

FIG. 6 indicates a logic circuit arrangement according to still another embodiment of the invention capable of preventing any erroneous operation that might take place the logic circuits of the invention are cascade connected;

FIG. 7 illustrates the wave forms associated with FIG. 6; and

Figure 8:
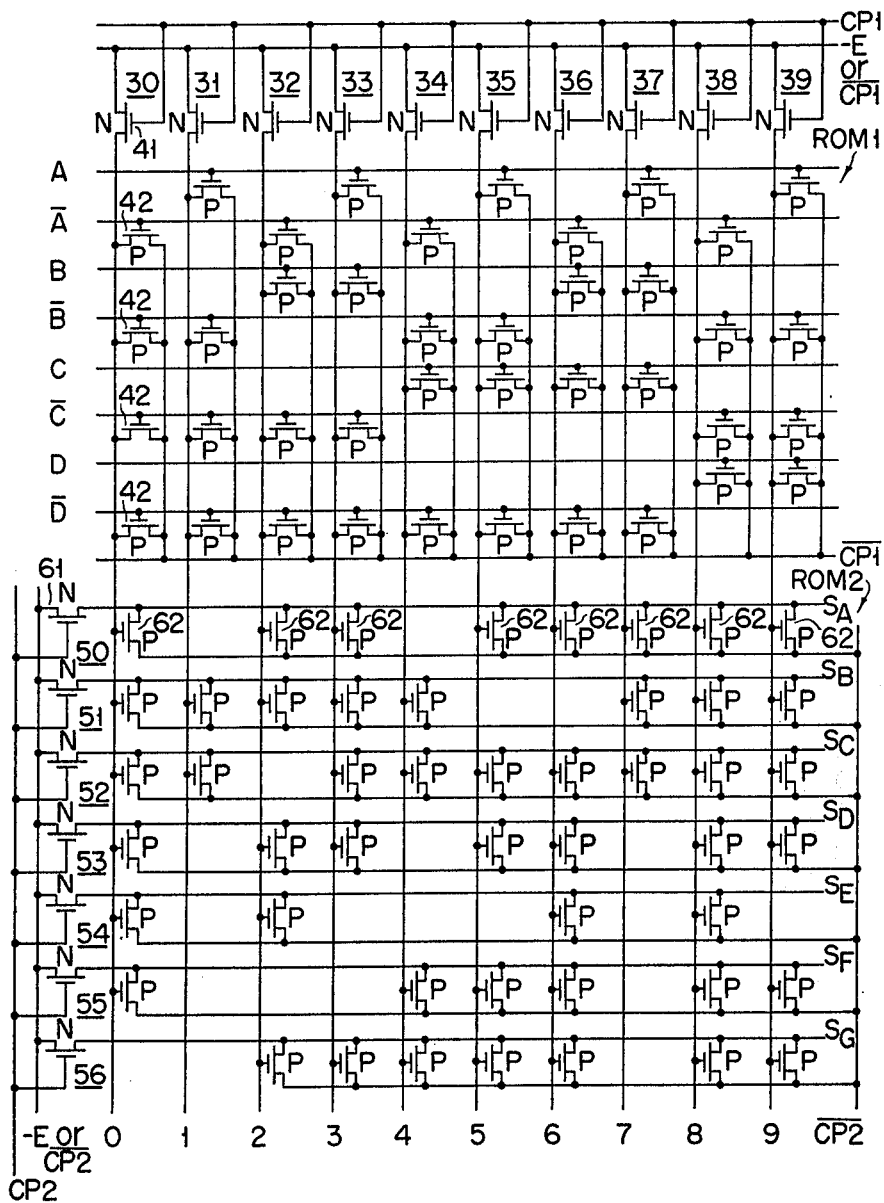
Figure 9:
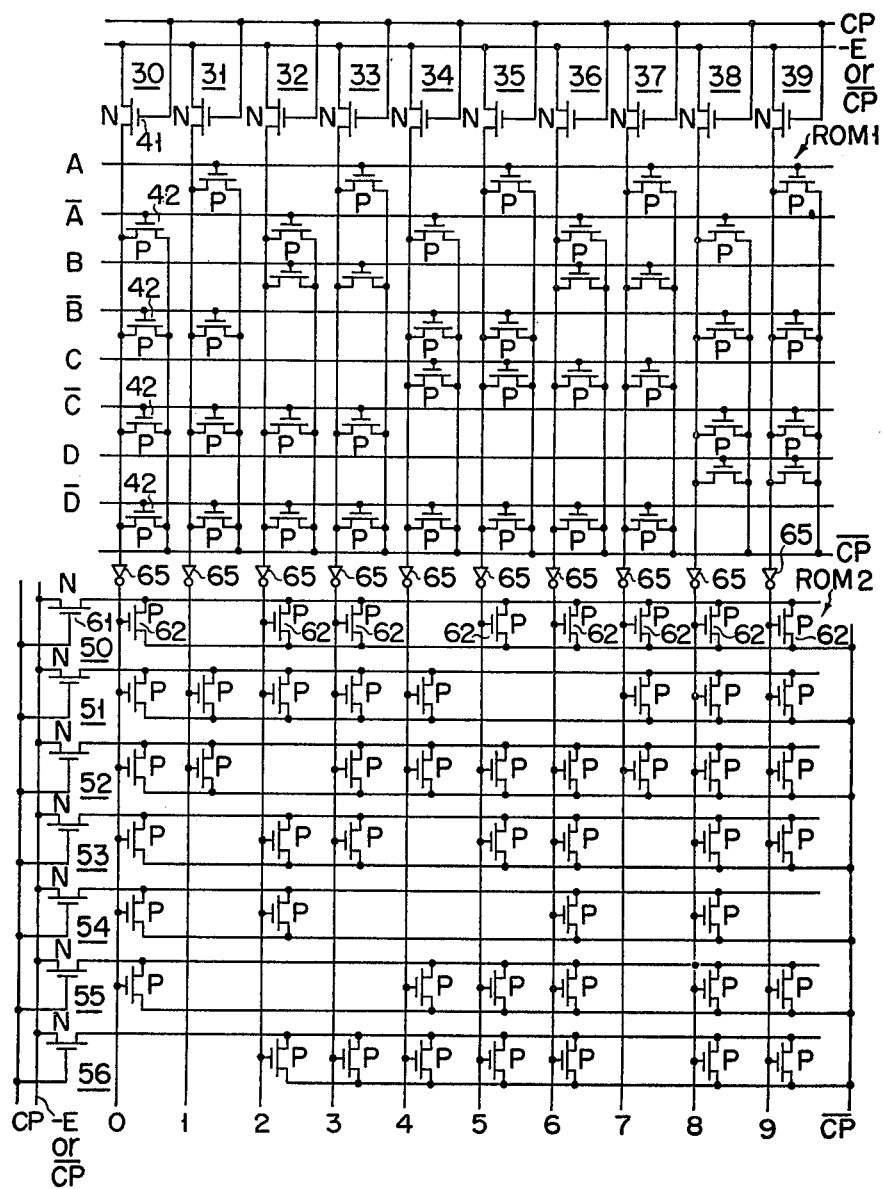
Figure 10:
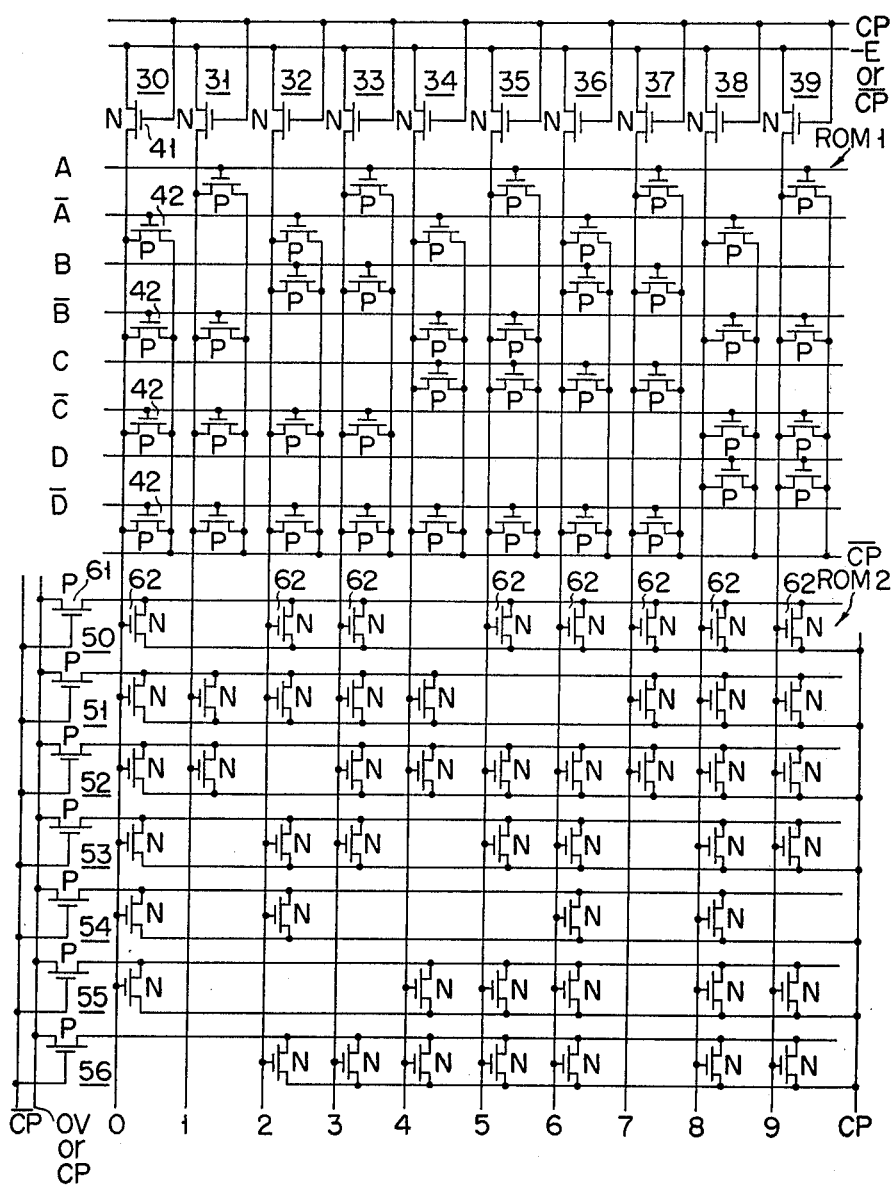

FIGS. 8, 9 and 10 present read only memory circuits utilizing logic circuits of the invention.

Figure 1A:
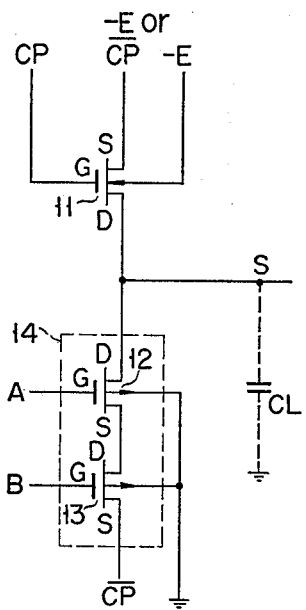
FIG. 1A is a logic circuit according to an embodiment of this invention.

Referring to FIG. 1A showing the logic circuit of this invention, referential numeral 11 denotes an n-channel type first insulated gate field effect transistor constituting a load. Referential numerals 12 and 13 represent p-channel type second insulated gate field effect transistors jointly constituting a logic gate 14. The drain or second electrode of the n-channel type first transistor 11 is connected to that of one p-channel type second transistor 12 whose source or first electrode is connected to the drain electrode of the other second transistor 13. The semiconductor substrate of the first transistor 11 is connected to a power source of −E volts, and the semiconductor substrates of the second transistors 12 and 13 are grounded. The gate and source electrodes of the first transistor 11 are supplied with first and second clock pulse signals CP and $\overline{CP}$ bearing a complementary relationship with each other. The source electrode of the second transistor 13 is supplied with the clock pulse signal $\overline{CP}$. The gate electrodes of the second transistors 12 and 13 jointly constituting the logic gate 14 are supplied with data signals A and B respectively. An output signal is delivered from the junction of the first transistor 11 and the second transistor 12. A notation CL represents an output capacitance.

Where the gate electrode of the n-channel type first transistor 11 is supplied with a voltage bearing a positive relationship with respect to the substrate, then the conduction path defined between the source and drain is rendered conducting to present a low impedance. Conversely where the gate electrode of the n-channel type first transistor 11 is supplied with a voltage having the same level as that impressed on the substrate, then the aforesaid conduction path becomes inoperative to display a high impedance. On the other hand, where the gate electrodes of the p-channel type second transistors 12 and 13 are supplied with a voltage having the same level as that impressed on the substrate, then the conductive paths of both transistors 12 and 13 are rendered nonconducting to present a high impedance, whereas, when the gate electrodes are supplied with a voltage bearing a negative relationship with respect to the substrate, then the conduction paths of the transistors 12 and 13 become conducting to indicate a low impedance.

There will now be described by reference to FIG. 1C the operation of the logic circuit of FIG. 1A. Now let it be assumed that the clock pulses CP and $\overline{CP}$ and data signals A and B have a voltage level of either —E volts or 0 volt as shown in FIG. 1C. Where the clock pulse signal $\overline{CP}$ has a voltage level of 0 volt and in consequence the complenetary clock pulse signal CP has a voltage level of —E volts, then the first transistor 11 is rendered conducting, causing the output capacitance CL to be charged up to —E volts through the conduction path of the first transistor 11, regardless of whether the second transistors 12 and 13 become operative or nonoperative. Where the clock pulse signals CP and $\overline{CP}$ have the voltage level reversed to —E volts and 0 volt respectively, then the first transistor 11 is rendered non-conducting. Under this condition, the voltage across the output capacitance CL varies with the condition of the second transistors 12 and 13. Where either of the data signals has a voltage level of 0 volt, then the serially connected conduction paths of the second transistors 12 and 13 collectively present a high impedance. Accordingly, the output capacitance CL charged to —E volts maintains this voltage level. Though leakage across the source and drain of a nonconducting transistor actually leads to the discharge of the capacitance CL, yet the amount of the discharge is negligible small.

Where both data signals A and B have a voltage level of —E volts, then the second transistors 12 and 13 are rendered conducting so that the output capacitance CL has its voltage level raised to 0 volt by being discharged through the conduction paths of the second transistors 12 and 13. Actually, however, the capacitance CL is discharged, as shown in a dotted line in FIG. 1C, with a certain time constant due to resistance occurring in the second transistors 12 and 13 when they are rendered conducting.

In the positive logic where, as apparent from the wave form diagram of FIG. 1C, a high voltage level is designated as "1" and a low voltage level as "0", the logic circuit of FIG. 1A functions as a NOR circuit (S = $\overline{A+B}$). In the negative logic where a high voltage level is denoted by "0" and a low voltage level by "1", the logic circuit acts as a NAND circuit (S = $\overline{A \cdot B}$).

The logic circuit of this invention requires only one clock pulse transistor as shown in FIG. 1A. Following is the reason. Where the gate electrodes of the second transistors 12 and 13 are impressed with a voltage of —E volts, while the output capacitance CL is charged, namely, while the first transistor 11 remains conducting, then both second transistors 12 and 13 become operative. Since, however, the source electrodes of the first transistor 11 and the second transistor 13 are supplied with the same clock pulse signal $\overline{CP}$ (—E volts), the potentials at both ends of a circuit path defined by the conduction paths of the first transistor 11 and the second transistors 12 and 13 are made equal, thereby preventing the passage of direct current through the circuit path. Through the conduction paths of the transistors 11, 12 and 13 only flow switching current or transient current. Therefore, the logic circuit of this invention prominently saves power consumption.

The foregoing description refers to the case where the clock pulse signal $\overline{CP}$ was supplied to the source electrodes of the first transistor 11 and the second transistor 13. However, it is not always necessary to supply the source electrode of the first transistor 11 with the clock pulse signal. As easily understood, connection of the source electrode to the power source of —E volts will attain the same object. The second transistors 12 and 13 constituting the logic gate 14 may, if required, be connected parallel. It is further possible to connect additional transistors in series with the second transistors 12 and 13 or to connected additional transistors parallel to serially connected transistors. The logic gate 14 may be formed of a single transistor 12. In this case, the logic circuit of FIG. 1A acts as an inverter or NOT circuit (S = $\overline{A}$).

Figure 1B:
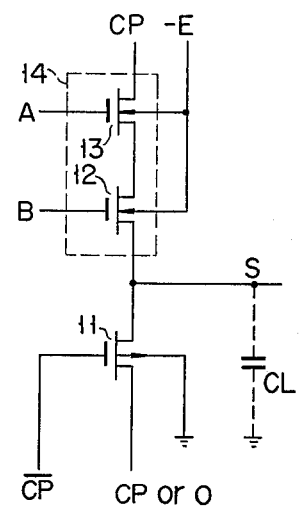
FIG. 1B is a modification of the logic circuit of FIG. 1A.
Figure 1C:
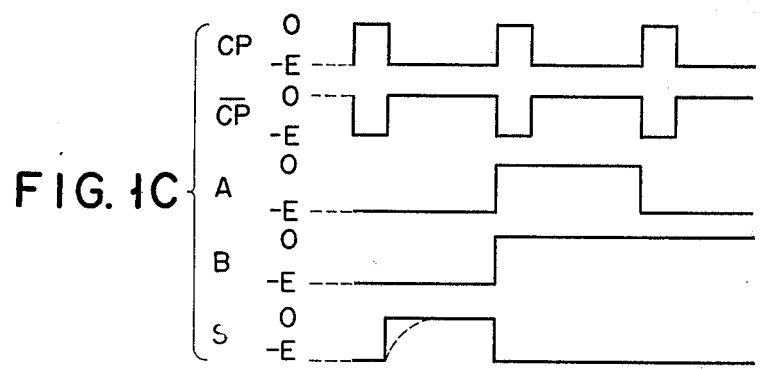
FIG. 1C represents the wave forms associated with the operation of the logic circuit of FIG. 1A.

The load transistor may be replaced by a transistor of p-channel type and the second transistors 12 and 13 constituting the logic circuit 14 may be substituted by transistors of n-channel type as shown in FIG. 1B. The parts of FIG. 3B the same as those of FIG. 1A are denoted by the same notations, description thereof being omitted. Referring to FIG. 1B, the gate electrode of the first transistor 11 is supplied with the clock pulse signal $\overline{CP}$ and the source electrode of the second transistor 13 is supplied with the complementary clock pulse signal CP. The source electrode of the first transistor 11 is grounded or supplied with a clock pulse signal CP. The logic circuit of FIG. 1B acts as a NAND circuit in the case of the positive logic and as a NOR circuit in the case of the negative logic.

A read only memory often consists of a plurality of cascade connected logic circuits. FIG. 2 represents a plurality of cascade connected logic circuits of this invention. A logic circuit 1 is cascade connected to a logic circuit 3 and a logic circuit 2 to the logic circuit 3. This logic circuit may be further cascade connected to the following logical circuit. In each logic circuit, load transistors 11-1, 11-2 and 11-3 consist, as in FIG. 1A, a n-channel type transistors, and the logic gates 14-1, 14-2 and 14-3 are formed of three groups of two parallel connected p-channel type transistors 12-1, 13-1; 12-2, 13-2; and 12-3, 13-3. The gate electrodes of the transistors 12-1 and 13-1 constituting the logic gate 14-1 are supplied with data signals A and B respectively. The gate electrodes of the transistors 12-2 and 13-2 constituting the logic gate 14-2 are supplied with data signals C and D respectively. The transistors 12-3 and 13-3 constituting the logic gate 14-3 are supplied with output signals S1 and S2 from the logic circuits 1 and 2 respectively. In the case of the positive logic, the logic circuits 1, 2 and 3 act as NAND circuits and, in the case of the negative logic, act as NOR circuits.

The embodiment of FIG. 2 is characterized in that clock pulse signals CP2 and $\overline{CP2}$ supplied to the second stage logic circuit 3 have a larger pulse width than clock pulse signals CP1 and $\overline{CP1}$ supplied to the first stage logic circuits 1 and 2. This object resides in to prevent the later described erroneous operation which might take place in the logic circuit 3.

The capacitances C1, C2 and C3 indicated in FIG. 2 are output load capacitances each indicated by a total of the diffusion capacitance (PN junction capacitance) through the junction of the drain and substrate, wiring capacitance and the gate capacitance of the transistor of the succeeding logic circuit. The insulated gate field effect transistors constituting the logic gates may be connected in series as occasion demands and have different channel widths and in consequence different values of mutual conductance gm. Accordingly, the time constant of discharge determined by the load capacitances C1, C2 and C3 and the conductance gm are likely to increase depending on the number and the connection of transistors used in the logic circuits.

As the result, there occur, as shown in FIGS. 3A and 3B, time delays $t1$ and $t2$ in causing the capacitances C1 and C2 to be discharged to 0 volt after being charged to −E volts.

Where the logic circuits 1, 2 and 3 are supplied with common clock pulse signals CP and $\overline{CP}$, the capacitances C1, C2 and C3 are all charged to −E volts due to the load transistors 11-1, 11-2 and 11-3 being rendered conducting at the same time. Where data signals A, B, C and D alike have a voltage level of −E volts after the load transistors 11-1, 11-2 and 11-3 become inoperative, then the transistors 12-1, 13-1, 12-2 and 13-2 are jointly rendered conducting to give rise to the discharge of the capacitances C1 and C2. If, in this case, discharge is immediately carried out and the output signals S1 and S2 from the logic circuits 1 and 2 respectively are quickly made to have 0 volt, then the transistors 12-3 and 13-3 constituting the logic gate 14-3 will become inoperative, preventing the capacitance C3 from being discharged, and in consequence the output signal S3 from the logic circuit 3 will maintain a voltage level of −E volts to attain a proper logic operation. Since, however, time delays arise in discharge as described above, the transistors 12-3 and 13-3 constituting the logic gate 14-3 are kept conducting for some time and thereafter become inoperative. As the result, while the transistors 12-3 and 13-3 remain conducting, the capacitance C3 continues to be discharged to 0 volt, thereby causing, as shown in a dotted line in FIG. 3B, the output signal S3 from the logic circuit 3 to present a wrong voltage level.

The will now be described by reference to FIG. 3A the case where the clock pulse signals supplied to the preceding logic circuits 1 and 2 and the succeeding logic circuit 3 are made to have different pulse widths. According to this invention, the period in which the load transistor 11-3 of the succeeding logic circuit 3 is rendered conducting by clock pulse signals CP2 and $\overline{CP2}$ is made longer than the conduction period of the load transistors 11-1 and 11-2 of the preceding logic circuits 1 and 2. Namely, the output capacitance C3 of the succeeding logic circuit 3 has a longer charging period to a required extent than the output capacitances C1 and C2 of the preceding logic circuits 1 and 2. Therefore, even when the transistors 12-3 and 13-3 constituting the logic gate 14-3 are rendered conducting by output signals S1 and S2 from the preceding logic circuits 1 and 2 until the voltages of the output signals S1 and S2 reach the gate threshold voltage of the transistors 12-3 and 13-3, the capacitance C3 still continues to be charged, thereby preventing the output signal S3 from the succeeding logic circuit 3 from presenting a wrong voltaage level due to the aforesaid premature discharge of the capacitance C3.

As mentioned above, where a plurality of cascade connected logic circuits are supplied with clock pulse signals whose width progressively increases toward the terminal unit of the cascade series, then no erroneous operation will result even though there occurs a delay on the generation of an output signal from any of the preceding and succeeding logic circuits. Therefore, after clock pulse signals are supplied to the terminal unit of a series of logic circuits, output data can be used.

However, if clock pulse signals supplied to the cascade connected logic circuits are made to have such width as progressively increases in the sequential order of the cascade connection, then numerous kinds of clock pulses will be required, resulting in the complicated construction of a clock pulse generator, the difficulty of designing the pattern of an integrated circuit and the enlargement of chip sizes, thereby limiting the number of logic circuits being cascade connected from practical application.

FIG. 4 represents a logic circuit arrangement according to another embodiment of the invention which can eliminate the above-mentioned drawbacks of the embodiment of FIG. 2. Between the preceding logic circuit 1 and the succeeding logic circuit 3 is disposed a known first inverter means 20 consisting of an n-channel type transistor 21 and a p-channel type transistor 22. Also between the preceding logic circuit 2 and the succeeding logic circuit 3 is provided a known second inverter means formed of an n-channel type transistor 24 and a p-channel type transistor 25. In the succeeding logic circuit 3, the transistors 12-3 and 13-3 have the conduction paths connected in series.

Where the load transistors 11-1, 11-2 and 11-3 are jointly rendered conducting by clock pulse signals CP and $\overline{CP}$, then the output capacitances C1, C2 and C3 are all charged to −E volts. Accordingly, output signals $\overline{S1}$ and $\overline{S2}$ from the first and second inverters 20 and 23 alike have 0 volt. Under this condition, the transistors 12-3 and 13-3 constituting the logic gate 3 are rendered nonconducting. Where the load transistors 11-1 and 11-2 are rendered nonconducting, then the capacitances C1 and C2 are discharged to 0 volt or kept at a voltage level of −E volts according as the transistors 12-1, 13-1, 12-2 and 13-2 are rendered conducting or nonconducting. If, in this case, the data signals A, B, C and D all have a voltage level of −E volts as shown in FIG. 5, then the capacitances C1 and C2 will be discharged. However, the capacitances C1 and C2 are not immediately brought to 0 volt due to the time constant of discharge. Since the transistors 21 and 24 remain nonconducting until the voltage levels of the capacitances C1 and C2 are changed from −E volts to the gate threshold voltage level of the transistors 21 and 24, output signals $\overline{S1}$ and $\overline{S2}$ from the first and second inverter means 20 and 23 are kept at 0 volt. Namely, even when the capacitances C1 and C2 begin to be discharged, the transistors 12-3 and 13-3 constituting the logic gate 14-3 are not immediately rendered conducting. Therefore, supply of the same type of clock pulse signal to the preceding and succeeding logic circuits does not give rise to the erroneous operation of logic circuits. In the embodiment of FIG. 4, the source electrodes of the p-channel type transistors 22 and 25 constituting the first and second inverters 20 and 23 may be supplied with clock pulse signal CP, and the gate electrodes of the transistors with clock pulse signal $\overline{CP}$, and the source electrodes of the n-channel type transistors 21 and 24 with clock pulse signal CP.

However, the embodiment of FIG. 4 has the drawback that it requires inverters, resulting in the increased number of elements used. FIG. 6 presents still another embodiment of this invention which eliminates the necessity of using such inverters. According to the embodiment of FIG. 6, where the load transistors 11-1 and 11-2 of the preceding logic circuits 1 and 2 are of n-channel type, the load transistor 11-3 of the succeeding logic circuit 3 is of n-channel type and in consequence the transistors 12-3 and 13-3 constituting the logic gate 14-3 of the succeeding logic circuit 3 are of n-channel type. The source electrode of the load transistor 11-3 of the succeeding logic circuit 3 is supplied with a clock pulse signal CP and the gate electrode thereof with a clock pulse signal $\overline{CP}$.

Where the output capacitances C1 and C2 are discharged starting with −E volts, the transistors 12-3 and 13-3 constituting the succeeding logic gate 14-3 non-conducting until the voltages of the capacitances C1 and C2 reach the gate threshold voltages of the transistors 12-3 and 13-3, thereby maintaining the voltage level of the output signal S3 from the succeeding logic circuit 3 at 0 volt. In the embodiment of FIG. 6, the transistors 12-3 and 13-3 constituting the succeeding logic gate 14-3 may be considered to have a function of acting as the inverter of FIG. 4. As in FIG. 4, the succeeding logic circuit of FIG. 6 do not present any erroneous operation even when it is supplied with common clock pulse signals CP and $\overline{CP}$. FIG. 7 indicates the wave forms associated with the embodiment of FIG. 6.

The aforementioned logic circuits of this invention are adapted for use with a read only memory. FIGS. 8, 9 and 10 illustrate a ROM device using the logic circuits of the invention. While the ROM device has various applications, there will now be described the case where the ROM device is used as a digit decoder in a desk top type electronic calculator and the like.

FIGS. 8, 9 and 10 indicate read only memory devices ROM1 and ROM2. The ROM1 device is a memory device for converting or decoding binary-coded decimal signals (A, $\overline{A}$, B, $\overline{B}$, C, $\overline{C}$, D, $\overline{D}$) into decimal signals (0 to 9). Upon receipt of output signals from the ROM1 device, the ROM2 device generates seven output signals SA to SG for selection of the seven electrode segments of a single digit-indicating tube. This tube displays one digit by combining some of the seven electrode segments. However, the ROM2 device is not required where there is used a digit-indicating tube commercially known as the Nixie tube which is provided with ten digit electrodes bearing the shapes of digits 0 to 9 respectively.

The ROM1 device has 10 memory units 30 to 39 matching ten digits 0 to 9. Each memory unit, for example, the memory unit 30 includes one first transistor 41 and four second transistors 42. Data signals are supplied to the gate electrodes of the four second transistors 42 of the respective memory units in predetermined combinations.

The ROM 2 device includes seven memory units (50 to 56) matching seven electrode segments. For example, the memory unit 50 has one first transistor 61 and eight second transistors 62. The gate electrodes of the eight second transistors 62 are supplied with output signals from the ROM1 device in a predetermined combination. The memory unit 50 selects an electrode segment A, showing that indication of numerals 0, 2, 3, 5, 6, 7, 8 and 9 of the ten digits must select the electrode segment A.

FIG. 8 corresponds to the embodiment of FIG. 2. Accordingly, the gate electrodes of the first transistors 41 of the ROM1 device and the source electrodes of the second transistors 42 of the ROM1 device are supplied with first and second clock pulse signals CP1 and $\overline{CP1}$ bearing a complementary relationship with each other. The gate electrodes of the first transistors 61 of the ROM2 device and the source electrodes of the second transistors 62 of the ROM2 device are supplied with another group of clock pulse signals CP2 and $\overline{CP2}$ which have a larger width than the first group of clock pulse signals CP1 and $\overline{CP1}$.

FIG. 9 corresponds to the embodiment of FIG. 4. Between the ROM1 and ROM2 devices are connected inverters 65. As in FIG. 4, the ROM1 and ROM2 devices of FIG. 9 are supplied with common complementary clock pulse signals CP and $\overline{CP}$.

FIG. 10 corresponds to the embodiment of FIG. 6. The first transistors of the ROM1 device and the first transistors of the ROM2 device are of opposite channel types, and further supplied with common complementary clock pulse signals CP and $\overline{CP}$.

What is claimed is:

1. A logic circuit arrangement comprising:

a plurality of logic circuits, outputs of at least two preceding logic circuits being coupled to inputs of a succeeding logic circuit;

a source of first and second clock pulses;

each of said at least two preceding logic circuits including first and second power supply terminals, a first output terminal, at least one first input terminal for receiving a data input signal, a first insulated gate field effect transistor of a first channel type having gate, source and drain electrodes, the source-drain path of said first insulated gate field effect transistor being coupled between said first power supply terminal and said first output terminal and the gate electrode of said first insulated gate field effect transistor being coupled to receive a first clock pulse, and at least one second insulated gate field effect transistor of a second channel type having gate, source and drain electrodes, the source-drain path of said at least one second insulated gate field effect transistor being coupled between said first output terminal and said second power supply terminal and the gate electrode of said at least one second insulated gate field effect transistor being coupled to said at least one first input terminal;

said succeeding logic circuit comprising third and fourth power supply terminals, a second output terminal, at least two second input terminals coupled to said first output terminals of said at least two preceding logic circuits, respectively, a third insulated gate field effect transistor of said first channel type having gate, source and drain electrodes, the source-drain path of said third insulated gate field effect transistor being coupled between said third power supply terminal and said second output terminal, and the gate electrode of said third insulated gate field effect transistor being coupled to receive a second clock pulse, and at least two fourth insulated gate field effect transistors of said second channel type each having gate, source and drain electrodes, the source-drain paths of said at least two fourth insulated field effect transistors being coupled between said second output terminal and said fourth power supply terminal, and the gate electrodes of said at least two fourth insulated gate field effect transistors being coupled to said second input terminals, respectively;

said clock pulse source providing said first and second clock pulses each of which has a first voltage level period and a second voltage level period following said first voltage level period, the first voltage level period of said first and second clock pulses starting at the same time and the first voltage level period of the second clock pulse being longer than that of the first clock pulse to thereby render a conducting period of said third transistor longer than that of said first transistor; and means for supplying third and fourth clock pulses which are respectively complementary to said first and second clock pulses, to said second and fourth power supply terminals, respectively.

2. A logic circuit arrangement comprising:

a plurality of logic circuits, outputs of at least two preceding logic circuits being coupled to inputs of a succeeding logic circuit;

a source of a first clock pulse;

each of said at least two preceding logic circuits including first and second power supply terminals, a first output terminal, at least one first input terminal for receiving a data input signal, a first insulated gate field effect transistor of a first channel type having gate, source and drain electrodes, the source-drain path of said first insulated gate field effect transistor being coupled between said first power supply terminal and said first output terminal and the gate electrode of said first insulated gate field effect transistor being coupled to receive a first clock pulse, and at least one second insulated gate field effect transistor of a second channel type having gate, source and drain electrodes, the source-drain path of said at least one second insulated gate field effect transistor being coupled between said first output terminal and said second power supply terminal and the gate electrode of said at least one second insulated gate field effect transistor being coupled to said at least one first input terminal;

said succeeding logic circuit comprising third and fourth power supply terminals, a second output terminal, at least two second input terminals coupled to said first output terminals of said at least two preceding logic circuits, respectively, a third insulated gate field effect transistor of said first channel type having gate, source and drain electrodes, the source-drain path of said third insulated gate field effect transistor being coupled between said third power supply terminal and said second output terminal, and the gate electrode of said third insulated gate field effect transistor being coupled to receive said first clock pulse, and at least two fourth insulated gate field effect transistors of said second channel type each having gate, source and drain electrodes, the source-drain paths of said at least two fourth insulated field effect transistors being coupled between said second output terminal and said fourth power supply terminal, and the gate electrodes of said at least two fourth insulated field effect transistors being coupled to said second input terminals, respectively;

first and second inverters coupled between said first output terminals of said at least two preceding logic circuits and said at least two second inputs of said succeeding logic circuit, respectively, each of said first and second inverters comprising a pair of complementary insulated gate field effect transistors the source-drain paths of which are coupled in series with each other and across a supply source; and means for supplying a second clock pulse, which is complementary to said first clock pulse, to each of said second and fourth power supply terminals.

* * * * *